(12) United States Patent
Arora et al.

(10) Patent No.: US 9,464,348 B2
(45) Date of Patent: Oct. 11, 2016

(54) METHOD FOR MAKING A PATTERNED PERPENDICULAR MAGNETIC RECORDING DISK USING GLANCING ANGLE DEPOSITION OF HARD MASK MATERIAL

(71) Applicant: HGST Netherlands B.V., Amsterdam (NL)

(72) Inventors: Hitesh Arora, Fremont, CA (US); Jean-Marc L. Beaujour, San Jose, CA (US); Zuwei Liu, San Jose, CA (US); Tsai-Wei Wu, San Jose, CA (US)

(73) Assignee: HGST Netherlands B.V., Amsterdam (NL)

( * ) Notice: Subject to any disclaimer, the term of this patent is extended or adjusted under 35 U.S.C. 154(b) by 241 days.

(21) Appl. No.: 14/469,412

(22) Filed: Aug. 26, 2014

(65) Prior Publication Data

US 2016/0064026 A1     Mar. 3, 2016

(51) Int. Cl.
    *C23C 14/30*      (2006.01)
    *G11B 5/84*      (2006.01)
    *G11B 5/855*      (2006.01)

(52) U.S. Cl.
CPC ............... *C23C 14/30* (2013.01); *G11B 5/855* (2013.01)

(58) Field of Classification Search
CPC .......... C23C 14/30; G11B 5/855; G11B 5/84
USPC .................................... 204/192.34; 360/135
See application file for complete search history.

(56) References Cited

U.S. PATENT DOCUMENTS

| | | |
|---|---|---|
| 2011/0038082 A1 | 2/2011 | Fan et al. |
| 2012/0190204 A1 | 7/2012 | Graves-Abe et al. |
| 2014/0087016 A1* | 3/2014 | Gao .................... G11B 5/855 |
| | | 425/470 |

* cited by examiner

*Primary Examiner* — Rodney McDonald
(74) *Attorney, Agent, or Firm* — Thomas R. Berthold

(57) ABSTRACT

A method for making a bit-patterned media (BPM) magnetic recording disk by etching the recording layer using a patterned hard mask layer uses glancing angle deposition (GLAD) of additional hard mask material as a capping layer onto the tops of the patterned hard mask pillars while the disk is rotated about an axis orthogonal to the plane of the disk. In one embodiment the capping layer is deposited after the pillars have been only partially eroded during a partial ion-milling of the recording layer. Ion-milling is then again performed to remove the remaining recording layer material. In another embodiment, before ion-milling of the recording layer, the capping layer is deposited onto the tops of the un-eroded hard mask pillars. This increases the lateral dimension of the hard mask pillars so that after ion-milling of the recording layer, the magnetic islands have an increased lateral dimension.

17 Claims, 9 Drawing Sheets

METHOD FOR MAKING A PATTERNED PERPENDICULAR MAGNETIC RECORDING DISK USING GLANCING ANGLE DEPOSITION OF HARD MASK MATERIAL

BACKGROUND OF THE INVENTION

1. Field of the Invention

This invention relates generally to patterned-media perpendicular magnetic recording disks, and more particularly to a method for making the disks.

2. Description of the Related Art

Magnetic recording hard disk drives with patterned magnetic recording media, also called bit-patterned media (BPM), have been proposed to increase data density. In BPM the magnetic recording layer on the disk is patterned into small discrete magnetic data islands or "dots" arranged in concentric data tracks. BPM disks may be perpendicular magnetic recording disks, wherein the magnetization directions of the magnetized regions are perpendicular to or out-of-the-plane of the recording layer. To produce the required magnetic isolation of the patterned data islands, the magnetic moment of the spaces between the islands must be destroyed or substantially reduced to render these spaces essentially nonmagnetic.

In one method for forming the discrete magnetic islands, a continuous hard mask layer is formed over a continuous recording layer. A layer of resist is then patterned on the hard mask layer, for example by nanoimprint lithography. The hard mask layer is then etched, using the patterned resist as a mask, to form pillars of hard mask material on the recording layer. The recording layer is then etched, typically by ion-milling, using the hard mask pillars as an etch mask, to replicate the pattern of hard mask pillars onto the underlying recording layer. The hard mask material is removed, leaving the pattern of magnetic islands separated by nonmagnetic spaces or "trenches".

To achieve recording densities of greater than 1 Terabytes/square inch ($Tb/in^2$), the width of the magnetic islands and the width of the nonmagnetic trenches are critical dimensions that are required to be extremely small, e.g., between 5 and 20 nm, and to have very small tolerances. Thus a challenge to achieve higher areal bit density is in the ability to create uniformly-shaped discrete magnetic islands with narrow trenches between the islands. The physical shape of the hard mask pillars that are formed from the etching process, i.e., their height, width and edge slope, affect the dimensions of the magnetic islands. Optimization of the hard mask pillar geometry together with optimization of the ion-milling process is needed to create a uniform array of magnetic islands. The ion-milling process also erodes the hard mask pillars. However, if some of the hard mask pillars are shorter than desired, or if the etching time is too long, the pillars may be excessively eroded. Also, some of the hard mask material may be re-deposited on the pillars' sidewalls. The hard mask pillar erosion and sidewall re-deposition results in pillars with undesirable shapes, such as large edge slope and large distribution in width, which carries over into the shape of the etched magnetic islands. The non-uniform shape of the magnetic islands translates into poor recording performance of the BPM.

An additional limitation of the prior art method using nanoimprint lithography is that the lateral dimension of the magnetic islands is fixed by the imprint template and cannot be altered. In certain cases it may be desirable to increase the lateral dimension of the magnetic islands during the ion-milling process, for example to decrease the spacing between the islands.

What is needed is a method for making a BPM disk using a patterned hard mask layer that creates uniformly shaped magnetic islands and that also allows the lateral dimension of the magnetic islands to be increased.

SUMMARY OF THE INVENTION

Embodiments of this invention relate to a method for making a bit-patterned media (BPM) magnetic recording disk using glancing angle deposition (GLAD) of additional hard mask material as a capping layer onto the tops of the hard mask pillars while the disk substrate is rotated about an axis orthogonal to the plane of the substrate. The hard mask pillars are formed by etching a patterned resist layer that may be patterned by nanoimprint lithography using an imprint stamper or template. In one embodiment the capping layer is deposited onto the tops of the hard mask pillars after the pillars have been only partially eroded during an ion-milling step that removes only a portion of the recording layer material. After deposition of the capping layer, ion milling is again performed to remove additional recording layer material. This process of additional capping layer deposition and ion milling can continue until all of the recording layer material has been ion milled away.

In another embodiment, after the hard mask pillars have been formed and before ion-milling of the recording layer, the capping layer is deposited onto the tops of the un-eroded hard mask pillars. This increases the lateral dimension of the hard mask pillars so that after ion-milling of the recording layer, the magnetic islands have a lateral dimension greater than the lateral dimension defined by the imprint template and are thus spaced closer together.

For a fuller understanding of the nature and advantages of the present invention, reference should be made to the following detailed description taken together with the accompanying figures.

DETAILED DESCRIPTION OF THE INVENTION

Figure 1:
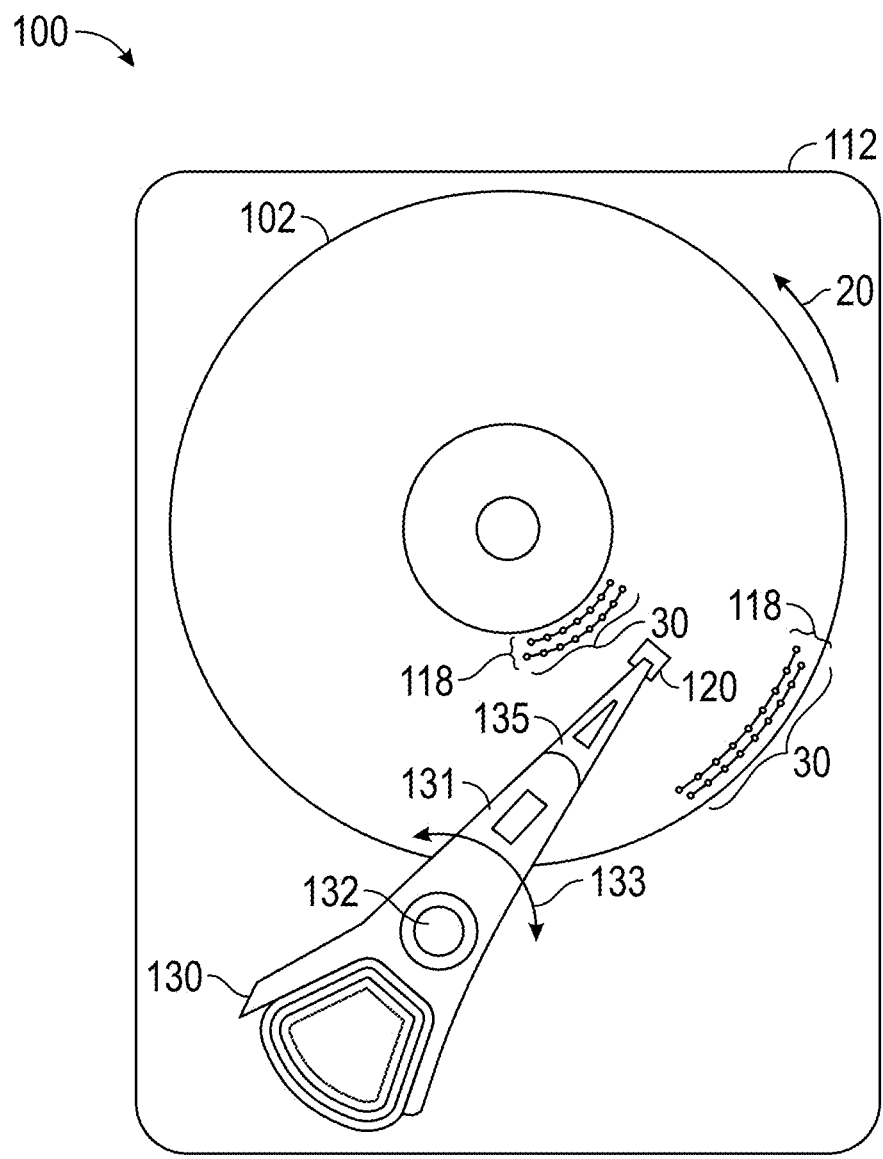
FIG. 1 is a top view of a bit-patterned media (BPM) magnetic recording disk drive with a BPM magnetic recording disk.

FIG. 1 is a top view of a bit-patterned media (BPM) magnetic recording disk drive 100 with a BPM magnetic recording disk 102. The drive 100 has a housing or base 112 that supports an actuator 130 and a drive motor for rotating the magnetic recording disk 102. The actuator 130 may be a voice coil motor (VCM) rotary actuator that has a rigid arm 131 and rotates about pivot 132 as shown by arrow 133. A head-suspension assembly includes a suspension 135 that has one end attached to the end of actuator arm 131 and a head carrier, such as an air-bearing slider 120, attached to the other end of suspension 135. The suspension 135 permits the slider 120 to be maintained very close to the surface of disk 102 and enables it to "pitch" and "roll" on the air-bearing generated by the disk 102 as it rotates in the direction of arrow 20. A magnetoresistive read head (not shown) and an inductive write head (not shown) are typically formed as an integrated read/write head patterned as a series of thin films and structures on the trailing end of the slider 120, as is well known in the art. The slider 120 is typically formed of a composite material, such as a composite of alumina/titanium-carbide ($Al_2O_3$/TiC). Only one disk surface with associated slider and read/write head is shown in FIG. 1, but there are typically multiple disks stacked on a hub that is rotated by a spindle motor, with a separate slider and read/write head associated with each surface of each disk.

The BPM disk 102 includes a disk substrate and discrete data islands 30 of magnetizable material on the substrate. The data islands 30 are arranged in radially-spaced circular tracks 118, with only a few islands 30 and representative tracks 118 near the inner and outer diameters of disk 102 being shown in FIG. 1. The islands 30 are depicted as having a circular shape but the islands may have other shapes, for example generally rectangular, oval or elliptical. As the disk 102 rotates in the direction of arrow 20, the movement of actuator 130 allows the read/write head on the trailing end of slider 120 to access different data tracks 118 on disk 102.

Figure 2:
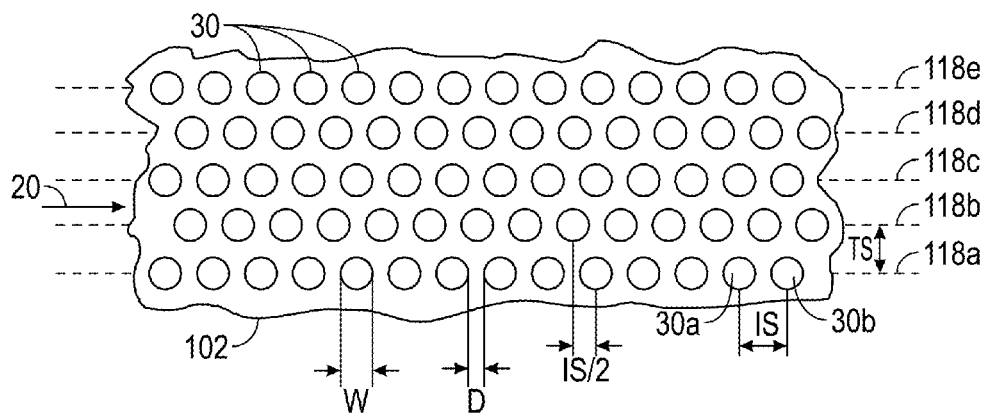
FIG. 2 is a top view of an enlarged portion of a BPM disk showing the detailed arrangement of the data islands.

FIG. 2 is a top view of an enlarged portion of disk 102 showing the detailed arrangement of the data islands 30 on the surface of the disk substrate in one type of pattern according to the prior art. The islands 30 contain magnetizable recording material and are arranged in circular tracks spaced-apart in the radial or cross-track direction, as shown by tracks 118a-118e. The tracks are typically equally spaced apart by a fixed track spacing TS. The spacing between the centers of data islands in a track is shown by distance IS between data islands 30a and 30b in track 118a, with adjacent tracks being shifted from one another by a distance IS/2, as shown by tracks 118a and 118b. Each island has a lateral dimension W parallel to the plane of the disk 102, with W being the diameter if the islands have a substantially circular shape. The islands may have other shapes, for example substantially rectangular or oval, in which case the dimension W may be considered to be the smallest dimension of the non-circular island, such as the smaller side of a rectangular island. The adjacent islands are separated by nonmagnetic spaces, with the spaces having a lateral dimension D. The value of D may be greater than the value of W. To achieve areal recording densities of greater than 1 Tb/in$^2$, the lateral dimension W of the islands, e.g., the diameter for circular-shaped islands 30, may be between 2 and 30 nm and the lateral dimension D of the spaces between the islands may be between 2 and 30 nm, with likely values of W and D being between 5 and 20 nm.

BPM disks like that shown in FIG. 2 may be perpendicular magnetic recording disks, wherein the magnetization directions are perpendicular to or out-of-the-plane of the recording layer in the islands. To produce the required magnetic isolation of the patterned data islands 30, the magnetic moment of the regions or spaces between the islands 30 must be destroyed or substantially reduced to render these spaces essentially nonmagnetic. The term "nonmagnetic" means that the spaces between the islands 30 are formed of a nonferromagnetic material, such as a dielectric, or a material that has no substantial remanent moment in the absence of an applied magnetic field, or a magnetic material in a trench recessed far enough below the islands 30 to not adversely affect reading or writing. The nonmagnetic spaces may also be the absence of magnetic material, such as trenches or recesses in the magnetic recording layer or disk substrate.

BPM disks may be fabricated by any of several known techniques. In one technique a continuous magnetic recording layer is deposited onto the disk substrate, a hard mask layer is deposited on the recording layer and a polymeric resist layer is deposited over the hard mask layer. Nanoimprint lithography (NIL) is then used to form a pattern of pillars and spaces in the resist layer. The patterned resist layer is then used as a mask to etch the underlying hard mask layer into a pattern of pillars and spaces. The patterned hard mask layer is then used as a mask to etch the underlying recording layer, typically by ion-milling, to form the pattern of magnetic islands and nonmagnetic spaces.

Figure 3A:
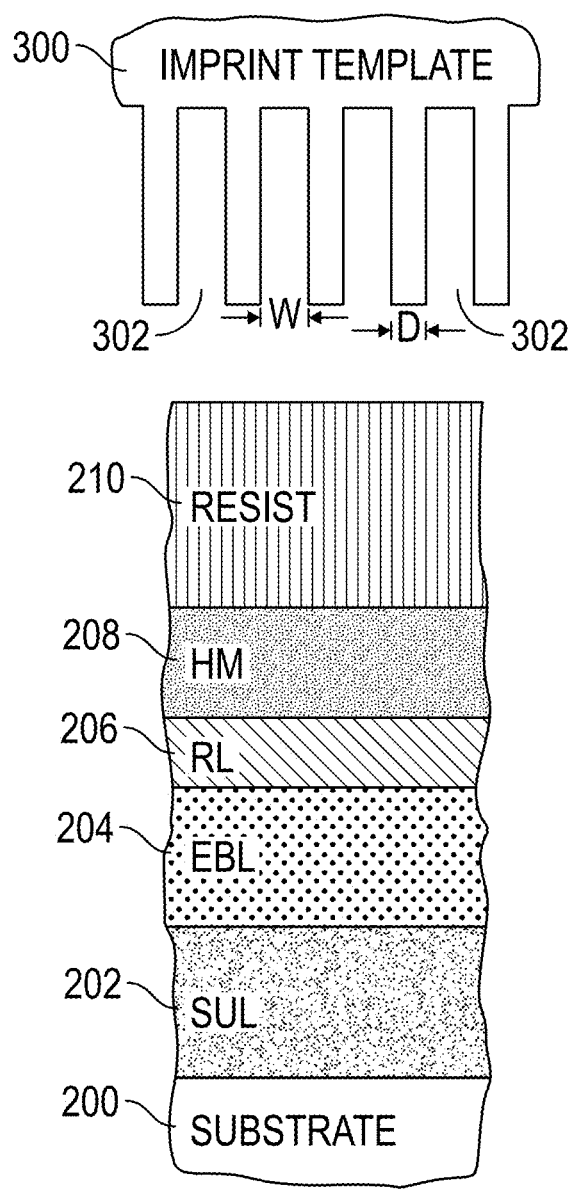
FIGS. 3A-3E are sectional views illustrating the prior art method for making a BPM disk using nanoimprint lithography and a hard mask layer.

FIGS. 3A-3E are sectional views illustrating the prior art method for making a BPM disk using nanoimprint lithography and a hard mask layer. FIG. 3A is a sectional view showing the disk according to the prior art before lithographic patterning and etching to form the data islands. The disk has a disk blank or substrate 200 supporting a soft underlayer (SUL) 202, an exchange break layer (EBL) 204 on the SUL and a recording layer (RL) 206 having perpendicular (i.e., generally perpendicular to substrate 200 surface) magnetic anisotropy on the EBL. The hard disk blank 200 may be any commercially available glass substrate, but may also be a conventional aluminum alloy with a NiP surface coating, or an alternative substrate, such as silicon, canasite or silicon-carbide. The SUL 202 acts as a flux return path for the magnetic write field and may be formed of magnetically permeable materials such as alloys of CoNiFe, FeCoB, CoCuFe, NiFe, FeAlSi, FeTaN, FeN, FeTaC, CoTaZr, CoFeTaZr, CoFeB, and CoZrNb, with a typical thickness of between about 30 to 400 nm. The SUL may also be a laminated or multilayered SUL formed of multiple soft magnetic films separated by nonmagnetic films, such as electrically conductive films of Al or CoCr. The SUL may also be a laminated or multilayered SUL formed of multiple soft magnetic films separated by interlayer films that mediate an antiferromagnetic coupling, such as Ru, Ir, or Cr or alloys thereof. An exchange break layer (EBL) 204 is an underlayer for the RL and is located on top of the SUL and acts to break the magnetic exchange coupling between the magnetically permeable films of the SUL and the RL 206. The EBL may be a nonmagnetic Ru or Ru alloy with a thickness in the range of about 10 to 30 nm. The RL 206 for BPM may be formed of one of the known materials that exhibit perpendicular magnetic anisotropy with a thickness in the range of about 4 to 10 nm. These include segregant-free cobalt alloys, such as a CoPtCr alloy, multilayers such as Co/Pt, Co/Pd, Fe/Pt and Fe/Pd multilayers, and FePt or CoPt alloys chemically-ordered in the $L1_0$ phase.

Figure 3C:
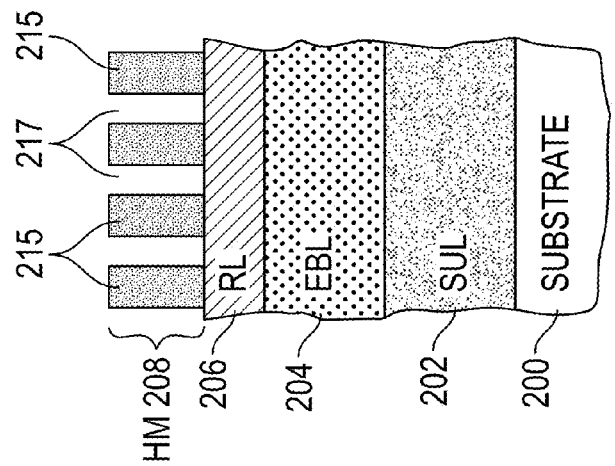
Figure 3B:
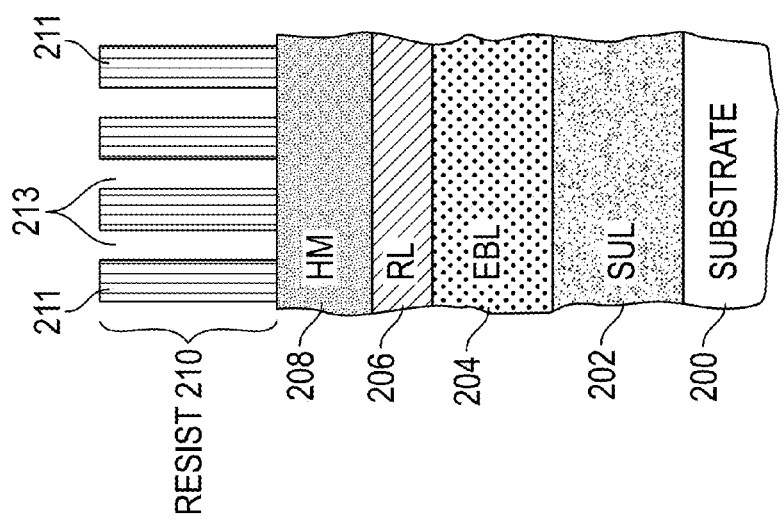

As shown in FIG. 3A, a hard mask (HM) layer 208 is formed on the RL to a thickness of about 3 to 25 nm and a layer 210 of imprint resist is deposited on the HM layer to a thickness of about 15 to 30 nm. The HM material may be any known material suitable as an ion-milling mask, such as diamond-like carbon (DLC), $SiO_2$ or SiN. The structure of FIG. 3A is then lithographically patterned by imprinting with a UV-transparent stamper or template 300 that has pattern of recesses 302 that will form the desired pattern of pillars in the resist layer 210. The recesses 302 have the shape corresponding to the desired shape of the magnetic islands, e.g., substantially circular, oval or rectangular. The recesses 302 have a lateral dimension W and spacing D close to the desired values of W and D for the subsequently formed magnetic islands. The template 300 is typically a fused quartz substrate that has been etched away in different etching steps to form the desired pattern of recesses 302. The template 300 with its predefined pattern is brought into contact with the liquid imprint resist layer 210, which may be an ultraviolet (UV)-curable polymer, and the template 300 and disk substrate 200 are pressed together. UV light is then transmitted through the transparent template 300 to cure the liquid imprint resist. After the resist has hardened, the template 300 is removed, leaving the inverse pattern of the template on the hardened resist layer. The template is separated from the disk and the patterned imprint resist is left. The resulting structure is shown in FIG. 3B with resist pillars 211 and trenches 213 of exposed HM layer 208.

The patterned imprint resist layer 210 is then used as an etch mask. Reactive-ion-etching (RIE) can be used to transfer the pattern from the imprint resist layer 210 to the underlying HM layer 208. Any imprint resist that remains after the RIE is then removed, leaving the resulting structure of HM pillars 215 separated by trenches 217 of RL material, as shown in FIG. 3C. The HM pillars 215 will have the shape of the recesses 302 of imprint template 300, e.g., substantially circular, oval or rectangular.

Figure 3E:
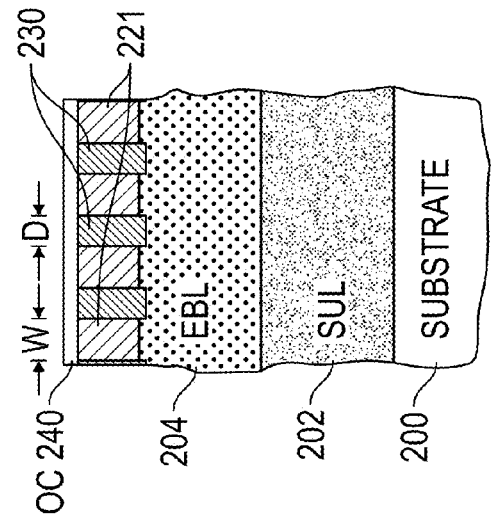
Figure 3D:
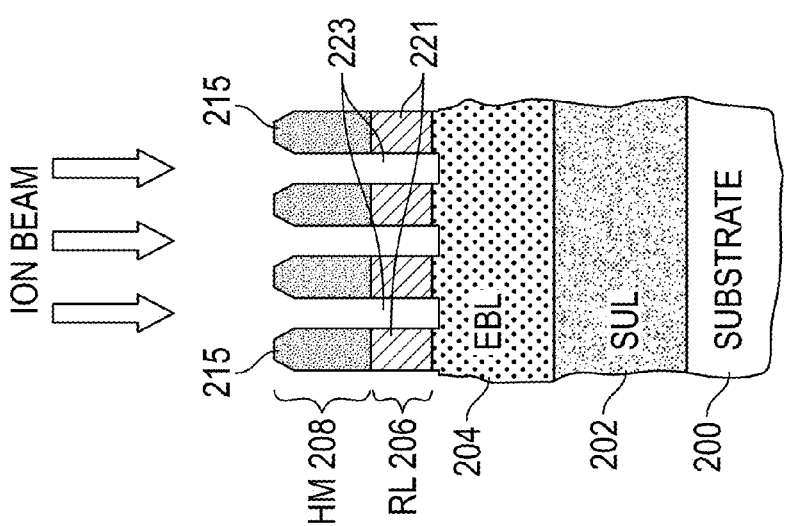

Next the pattern of HM pillars 215 is used as mask for ion-milling of the underlying RL, for example using a directional ion beam of Ar+ ions, as shown in FIG. 3D, to form the pattern of RL islands 221 and trenches 223. The ion-milling is orthogonal to the plane of the substrate and is performed to remove substantially all of the exposed RL, as well as portion of the EBL to assure that there is no RL material in the trenches 223. Also, as depicted in FIG. 3D, the ion-milling erodes the HM pillars 215, so that they may be shorter and with slightly rounded tops.

The remaining HM material is then removed; typically by reactive ion etching (RIE) or wet etch. FIG. 3E shows the completed BPM disk after deposition of fill material 230, such as DLC, in the trenches 223, planarization of the fill material 230, and deposition of a protective overcoat (OC) 240, which is typically DLC. The magnetic islands will have a lateral dimension W and a spacing D that is typically close to the dimensions W and D of the recesses 302 of imprint template 300 (FIG. 3A).

The ion-milling process erodes the hard mask pillars. However, if some of the hard mask pillars are shorter than desired, or if the etching time is too long, the pillars may be excessively eroded. Also, some of the hard mask material may be re-deposited on the pillars' sidewalls. The hard mask pillar erosion and sidewall re-deposition results in pillars with undesirable shapes, such as large edge slope and large distribution in width (lateral dimension), which carries over into the shape of the etched magnetic islands. In the completed BPM disk it is important that all of the data islands have the same value of W and all the spaces between the islands have the same value of D, within a small tolerance. The non-uniform shape of the magnetic islands and the non-uniform spacing of the islands translate into poor recording performance of the BPM disk.

An additional limitation of the prior art method using nanoimprint lithography is that the lateral dimension of the magnetic islands is fixed by the imprint template and cannot be altered. In certain cases it may be desirable to increase the lateral dimension of the magnetic islands during the ion-milling process, for example to decrease the spacing between the islands.

Embodiments of this invention use glancing angle deposition (GLAD) of additional hard mask material as a capping layer onto the tops of the hard mask pillars while the disk substrate is rotated about an axis orthogonal to the plane of the substrate. In one embodiment the capping layer is deposited onto the tops of the hard mask pillars after the pillars have been only partially eroded during an ion-milling step that removes only a portion of the recording layer material. After deposition of the capping layer, ion milling is again performed to remove additional recording layer material. This process of additional capping layer deposition and ion milling can continue until all of the recording layer material has been ion milled away. In another embodiment, after the hard mask pillars have been formed and before ion milling of the recording layer, the capping layer is deposited onto the tops of the un-eroded hard mask pillars. This increases the lateral dimension of the hard mask pillars so that after ion-milling of the recording layer, the magnetic islands have a lateral dimension greater than the lateral dimension defined by the imprint template and are thus spaced closer together.

Figure 4B:
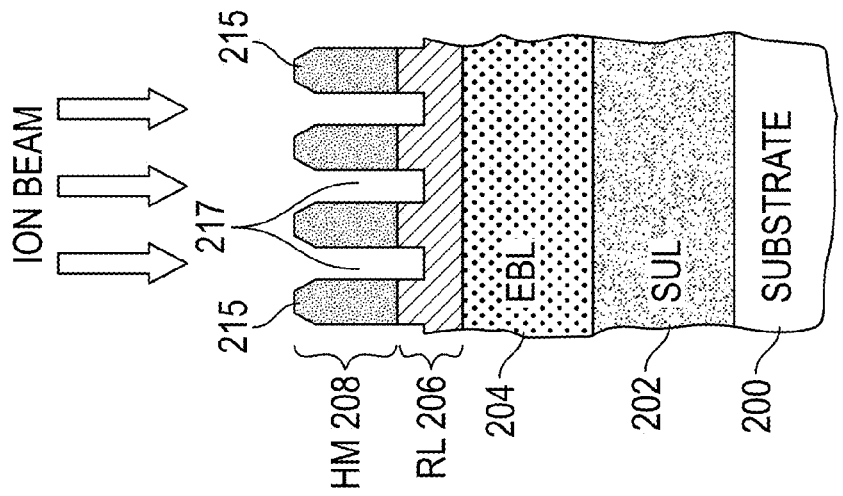
FIGS. 4A-4D are sectional views illustrating a first embodiment of the method for making a BPM disk using glancing angle deposition (GLAD) of additional hard mask material while rotating the disk.
Figure 4A:
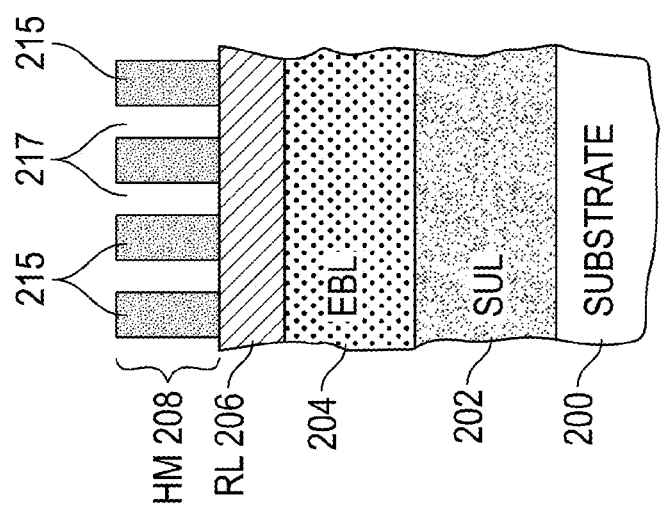

FIGS. 4A-4D are sectional views illustrating a first embodiment of the method for making a BPM disk using GLAD of additional hard mask material while rotating the disk. FIG. 4A is identical to FIG. 3C and shows the patterned HM pillars 215 and trenches 217 of exposed RL. There has not yet been any ion milling so the HM pillars are not eroded and have substantially flat tops.

In FIG. 4B the RL has been partially ion milled, using the HM pillars 215 as a mask, to remove only a portion of the RL in the trenches. This first ion-milling also partially erodes the HM pillars 217 making them shorter and with slightly rounded tops.

Figure 4D:
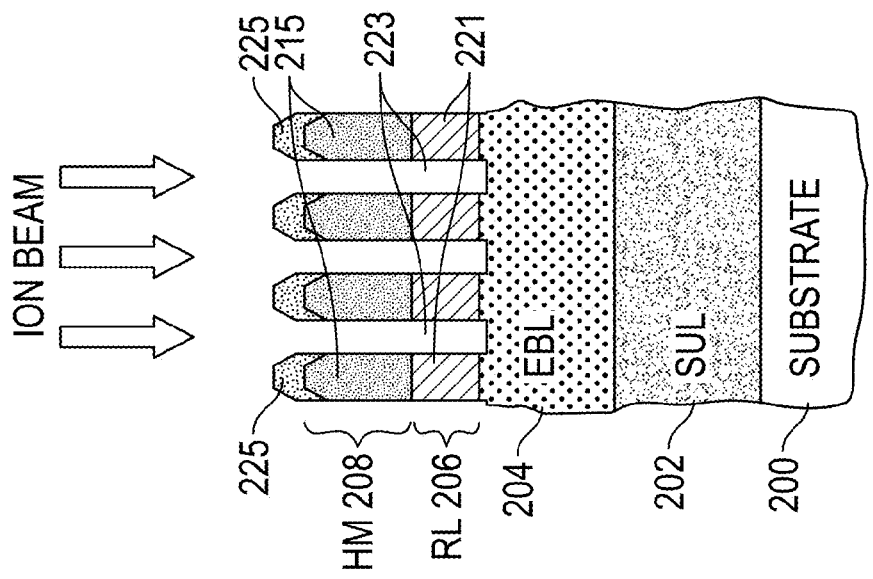
Figure 4C:
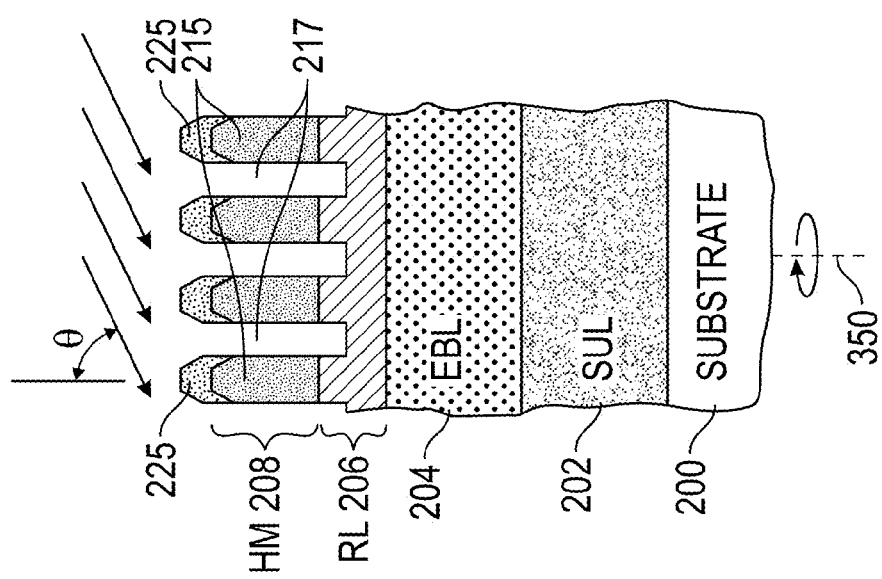

Next, in FIG. 4C a capping layer 225 is deposited on the tops of HM pillars 215 by GLAD while the disk is rotated about axis 350 normal to the disk. GLAD is a well-known technique in which material is deposited in a single direction with a mostly collimated deposition beam at an oblique angle relative to a normal to the substrate, such as by e-beam evaporation, thermal evaporation or ion beam deposition, using a shadow mask. When GLAD is performed while the substrate is rotated about an axis normal to the plane of the substrate, columns of the deposited material will be formed. Thus in this invention, the capping layer material is deposited only on the tops of the eroded HM pillars 215, but not in the trenches 217. This is because the angle θ is selected, based on the height/width aspect ratio of the HM pillars 215, such that HM pillars 215 shadow the trenches 217 from the capping layer material 225. For example, the height and width of the HM pillars may be in the range of about 15 to 30 nm and about 10 to 15 nm, respectively. The width of the trenches may be in the range of about 10 to 17 nm. This would result in selection of the angle θ to be between about 34 to 80 degrees. The capping layer 225 thus replenishes the HM material that was eroded from the tops of the HM pillars 215 by the partial ion-milling step. The capping layer material is additional hard mask material that may be the same or different from the material of the HM pillars. Ideally, the etch rate for the capping layer material should be the same or slower than for the HM material. The capping layer material may be formed of any known material suitable as an ion-milling mask, such as diamond-like carbon (DLC), Cr, $SiO_2$ or SiN.

Next, in FIG. 4D the RL material has been totally ion milled, using the HM pillars 215 with capping layer 225 as a mask, to remove the remaining RL material in the trenches 217. This ion-milling is preferably performed for a time sufficient to also remove a portion of the EBL underlying the RL in the trenches. This assures that there is no magnetic material in the trenches between the magnetic islands. This ion milling also partially erodes the capping layer 225 on the tops of the HM pillars 217 and leaves RL islands 221 separated by trenches 223. While only one partial ion-milling step is depicted, it is within the scope of the embodiment of this invention that two or more cycles of partial ion-milling may be performed, with each partial ion-milling being followed by additional capping layer deposition using GLAD while rotating the disk.

After the ion-milling in FIG. 4D, the remaining HM material is removed, typically by RIE or wet etch. The fill material deposition, planarization and protective OC deposition can then be performed as described above in FIG. 3E.

Figure 5B:
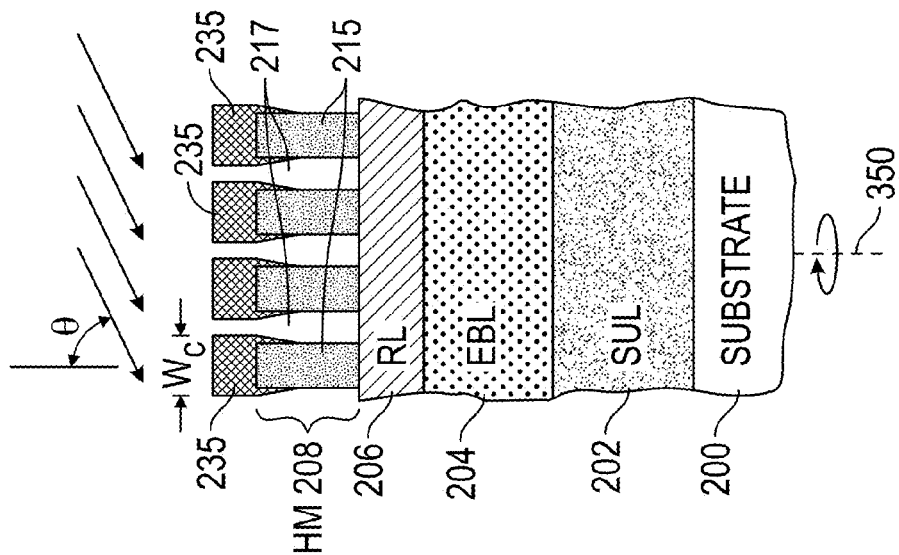
FIGS. 5A-5C are sectional views illustrating a second embodiment of the method for making a BPM disk using GLAD of additional hard mask material while rotating the disk.
Figure 5A:
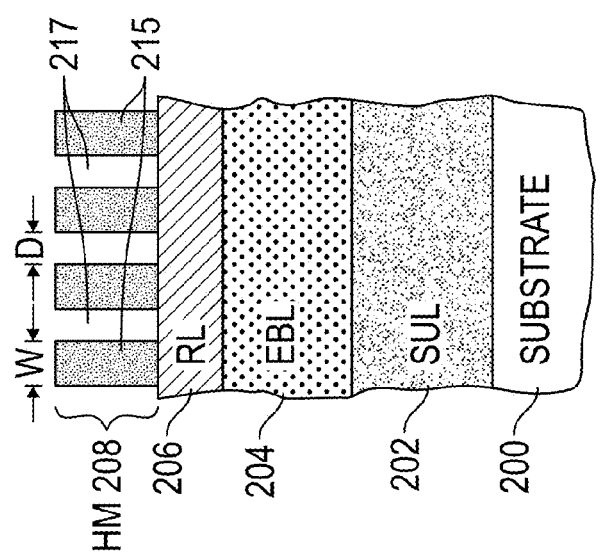
Figure 5C:
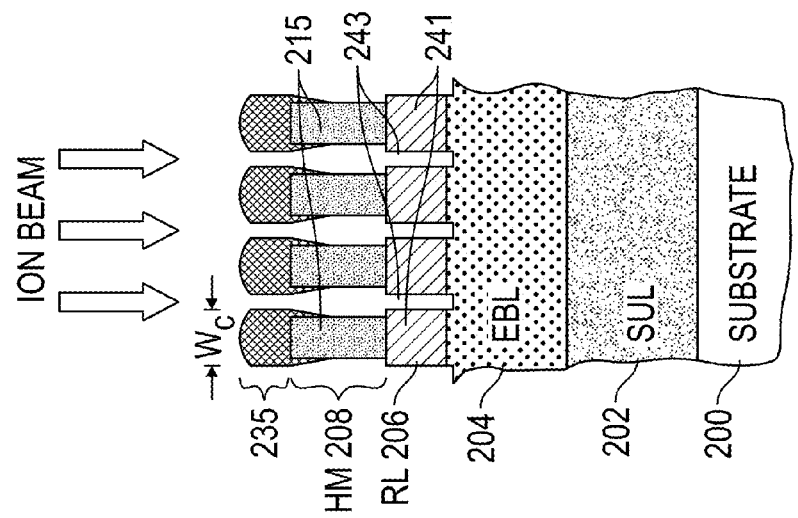

FIGS. 5A-5C are sectional views illustrating a second embodiment of the method for making a BPM disk using GLAD of additional hard mask material while rotating the disk. FIG. 5A is identical to FIG. 3C and shows the patterned HM pillars 215 and trenches 217 of exposed RL. The HM pillars 215 are depicted with a lateral dimension W, which is substantially the same as the lateral dimension W of the recesses 302 in the imprint template 300 (FIG. 3A). There has not yet been any ion-milling so the HM pillars 215 are not eroded and have substantially flat tops.

In FIG. 5B a capping layer 235 is deposited on the tops of HM pillars 215 by GLAD while the disk is rotated about axis 350 normal to the disk. Thus the capping layer deposition results in rounded HM pillar tops with a lateral dimension Wc. The HM pillars thus provide masks with a lateral dimension Wc that is greater than the lateral dimension W before the capping layer 235 deposition.

In FIG. 5C the RL material has been totally ion milled, using the HM pillars 215 with capping layer 235 as a mask, to remove the RL material in the trenches. This ion-milling is preferably performed for a time sufficient to also remove a portion of the EBL underlying the RL in the trenches. This assures that there is no magnetic material in the trenches between the magnetic islands. This ion-milling also partially erodes the capping layer 235 on the tops of the HM pillars 215 and leaves RL islands 241 separated by nonmagnetic trenches 243. However, as a result of the capping layer 235 which increases the lateral dimension of the HM pillars 215 to Wc, the RL islands 241 now have an increased lateral dimension substantially equal to Wc, which results in the RL islands 241 being more closely spaced. It is preferable that the material of the capping layer 235 have a slower etch rate than the material of the HM pillars. This assures that the RL islands will have a dimension We greater than W.

Figure 6A:
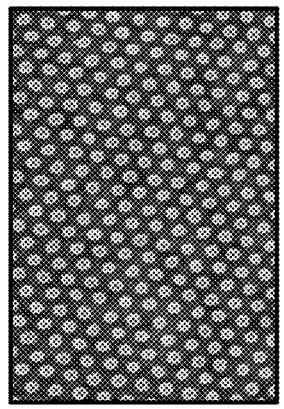
FIGS. 6A-6C are scanning electron microscopy (SEM) images illustrating the method of the second embodiment of the invention.
Figure 6B:
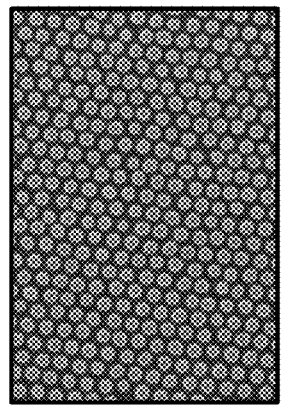
Figure 6C:
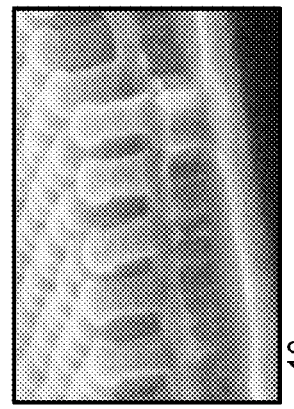

FIGS. 6A-6C are scanning electron microscopy (SEM) images illustrating the method of the second embodiment of the invention. FIG. 6A is a plan view of HM pillars 215 corresponding to FIG. 5A. The HM pillars are formed of DLC with a lateral dimension W of about 15 nm and with a spacing D between pillars of about 12 nm. FIG. 6B is a plan view of HM pillars 215 with capping layer 235 formed of Cr. FIG. 6C is a perspective view of the HM pillars 215 with capping layer 235 of FIG. 6B. The capping layer 235 has increased the lateral dimension to We of about 22 nm, which decreases the spacing D to about 5 nm. In this example, the capping layer was formed of Cr by GLAD at an angle θ of 45 degrees for a deposition time of 45 seconds while the disk was rotated a total of 7.5 revolutions. Cr has a slower ion-milling rate than DLC, the material of the HM pillars.

While the present invention has been particularly shown and described with reference to the preferred embodiments, it will be understood by those skilled in the art that various changes in form and detail may be made without departing from the spirit and scope of the invention. Accordingly, the disclosed invention is to be considered merely as illustrative and limited in scope only as specified in the appended claims.

What is claimed is:

1. A method for forming a patterned magnetic recording layer on a perpendicular magnetic recording disk comprising:
providing a disk substrate having a perpendicular magnetic recording layer with a hard mask layer formed on the recording layer;
patterning the hard mask layer into a plurality of pillars with trenches of exposed recording layer between the pillars;
forming on the tops of the hard mask pillars a capping layer by depositing capping layer material at an oblique angle to the substrate while rotating the substrate about an axis orthogonal to the plane of the substrate; and
ion-milling the exposed recording layer, using the capped hard mask pillars as an etch mask.

2. The method of claim 1 wherein the step of ion-milling is a first ion-milling step performed after patterning the hard mask layer and before forming the capping layer and comprises ion-milling to remove only a portion of the exposed recording layer; and further comprising, after forming the capping layer, performing a second ion-milling step to remove all of the remaining exposed recording layer to form a plurality of recording layer islands with trenches between the islands.

3. The method of claim 1 wherein the step of ion-milling is performed after forming the capping layer and comprises ion-milling to remove all of the exposed recording layer to form a plurality of recording layer islands with trenches between the islands.

4. The method of claim 3 wherein patterning the hard mask layer into pillars comprises patterning the hard mask layer into pillars with a lateral dimension, and wherein forming the capping layer increases said lateral dimension of the pillars.

5. The method of claim 3 wherein the capping layer material has a slower ion-milling rate than the hard mask layer material.

6. The method of claim 1 wherein patterning the hard mask layer comprises patterning the hard mask layer into a plurality of pillars arranged in concentric circular tracks with the pillars spaced apart along the tracks.

7. The method of claim 1 wherein patterning the hard mask layer comprises patterning the hard mask layer to define pillars having a shape selected from substantially circular, substantially rectangular and substantially oval.

8. The method of claim 1 wherein the hard mask layer consists of a material selected from diamond-like carbon, Cr, $SiO_2$ and SiN.

9. The method of claim 1 wherein depositing capping layer material comprises depositing material selected from diamond-like carbon (DLC), Cr, $SiO_2$ and SiN.

10. The method of claim 1 wherein depositing capping layer material comprises depositing capping layer material that is the same as the material of the hard mask layer.

11. A method for making a bit-patterned media perpendicular magnetic recording disk comprising:
provided a disk substrate having an underlayer, a perpendicular magnetic recording layer on the underlayer, a hard mask layer on the recording layer and an imprint resist layer on the hard mask layer;
patterning the hard mask layer by nanoimprint lithography into a plurality of spaced-apart pillars;
performing a first ion-milling of the recording layer underlying the hard mask pillars, using the hard mask pillars as a mask, to remove only a portion of the underlying recording layer, said first ion-milling eroding the tops of the hard mask pillars;
forming on the eroded tops of the hard mask pillars a capping layer by depositing capping layer material at an oblique angle to the substrate while rotating the substrate about an axis orthogonal to the plane of the substrate; and
performing a second ion-milling of the recording layer underlying the capped hard mask pillars, using the capped hard mask pillars as a mask, to remove substantially all of the remaining recording layer to form a plurality of spaced-apart recording layer islands with trenches of underlayer between the islands.

12. The method of claim 11 wherein patterning the hard mask layer comprises patterning the hard mask layer into a plurality of pillars arranged in concentric circular tracks with the pillars spaced apart along the tracks.

13. The method of claim 11 wherein patterning the hard mask layer comprises patterning the hard mask layer to define pillars having a shape selected from substantially circular, substantially rectangular and substantially oval.

14. A method for making a bit-patterned media perpendicular magnetic recording disk comprising:
providing a disk substrate having an underlayer, a perpendicular magnetic recording layer on the underlayer, a hard mask layer on the recording layer and an imprint resist layer on the hard mask layer;
patterning the hard mask layer by nanoimprint lithography into a plurality of spaced-apart pillars having tops with a lateral dimension W parallel to the plane of the substrate;
forming on the tops of the hard mask pillars a capping layer by depositing capping layer material at an oblique angle to the substrate while rotating the substrate about an axis orthogonal to the plane of the substrate, the capped pillar tops having a lateral dimension Wc greater than W; and
ion-milling the recording layer underlying the capped hard mask pillars, using the capped hard mask pillars as a mask, to remove substantially all of the underlying recording layer to form a plurality of spaced-apart recording layer islands with trenches of underlayer between the islands, the recording layer islands having a lateral dimension greater than W.

15. The method of claim 14 wherein patterning the hard mask layer comprises patterning the hard mask layer into a plurality of pillars arranged in concentric circular tracks with the pillars spaced apart along the tracks.

16. The method of claim 14 wherein patterning the hard mask layer comprises patterning the hard mask layer to define pillars having a shape selected from substantially circular, substantially rectangular and substantially oval.

17. The method of claim 14 wherein the capping layer material has a slower ion-milling rate than the hard mask layer material.

* * * * *